US011582866B1

(12) United States Patent
Zhou et al.

(10) Patent No.: US 11,582,866 B1
(45) Date of Patent: Feb. 14, 2023

(54) SYSTEMS INCLUDING A POWER DEVICE-EMBEDDED PCB DIRECTLY JOINED WITH A COOLING ASSEMBLY AND METHOD OF FORMING THE SAME

(71) Applicant: TOYOTA MOTOR ENGINEERING & MANUFACTURING NORTH AMERICA, INC., Plano, TX (US)

(72) Inventors: Feng Zhou, Ann Arbor, MI (US); Hiroshi Ukegawa, South Lyon, MI (US); Ercan Dede, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 0 days.

(21) Appl. No.: 17/382,521

(22) Filed: Jul. 22, 2021

(51) Int. Cl.
*H05K 1/02* (2006.01)
*H05K 3/02* (2006.01)

(52) U.S. Cl.
CPC ......... *H05K 1/0271* (2013.01); *H05K 1/0209* (2013.01); *H05K 3/022* (2013.01); *H05K 2201/064* (2013.01)

(58) Field of Classification Search
CPC .............. H05K 1/0271; H05K 1/0272; H05K 1/0201–0212; H05K 1/181–188; H05K 7/20272; H05K 7/20318; H05K 7/20309; H05K 7/20327; H05K 7/20336; H05K 7/20254; H05K 7/20772; H05K 7/20872; H05K 7/20927; H05K 7/20936; H05K 3/0061; H05K 3/0044; H05K 3/30; H05K 3/022; H05K 2201/06–068; H05K 2201/10416; H05K 2201/066; H05K 2201/10174; H01L 23/427; H01L 23/46;
(Continued)

(56) References Cited

U.S. PATENT DOCUMENTS 3,993,123 A * 11/1976 Chu ...................... H01L 23/473
257/E23.098
4,639,829 A * 1/1987 Ostergren ........... H01L 23/4006
257/713
(Continued)

FOREIGN PATENT DOCUMENTS

EP 3208841 B1 12/2020
KR 20120053427 A 5/2012
(Continued)

OTHER PUBLICATIONS

KR-101751108-B1 English Translation (Year: 2016).*
WO-2012171797-A1 English Translation (Year: 2012).*

*Primary Examiner* — Zachary Pape
*Assistant Examiner* — Amir A Jalali
(74) *Attorney, Agent, or Firm* — Dinsmore & Shohl LLP

(57) ABSTRACT

Systems including power device embedded PCBs coupled to cooling devices and methods of forming the same are disclosed. One system includes a power device embedded PCB stack, a cooling assembly including a cold plate having one or more recesses therein, and a buffer cell disposed within each of the one or more recesses. The cooling assembly is bonded to the PCB stack with a insulation substrate disposed therebetween. The cooling assembly is arranged such that the buffer cell faces the PCB stack and absorbs stress generated at an interface of the PCB stack and the cooling assembly.

20 Claims, 10 Drawing Sheets

(58) Field of Classification Search
CPC ....... H01L 23/50; H01L 23/473; H01L 23/34; H01L 23/36–3675; H01L 23/49822; H01L 23/3735; H01L 23/5389; H01H 9/52

See application file for complete search history.

(56) References Cited

U.S. PATENT DOCUMENTS

| | | | | |
|---|---|---|---|---|
| 5,329,419 | A * | 7/1994 | Umezawa | H01L 23/4338 |
| | | | | 165/185 |
| 5,944,093 | A * | 8/1999 | Viswanath | H01L 23/4006 |
| | | | | 174/15.2 |
| 6,181,006 | B1 * | 1/2001 | Ahl | H01L 23/433 |
| | | | | 257/E23.09 |
| 7,190,581 | B1 | 3/2007 | Hassani et al. | |
| 8,632,221 | B2 | 1/2014 | Yeh | |
| 9,520,305 | B2 | 12/2016 | Kulas | |
| 11,195,811 | B2 * | 12/2021 | Summerfelt | H01L 24/05 |
| 2004/0001324 | A1 * | 1/2004 | Ho | H01L 24/05 |
| | | | | 257/E23.178 |
| 2006/0087816 | A1 * | 4/2006 | Ewes | H01L 23/427 |
| | | | | 257/E23.088 |
| 2014/0036461 | A1 * | 2/2014 | Palaniswamy | H05K 1/021 |
| | | | | 174/254 |
| 2015/0255427 | A1 * | 9/2015 | Sung | H01L 23/5383 |
| | | | | 257/737 |
| 2017/0055378 | A1 * | 2/2017 | Zhou | H05K 7/20927 |
| 2018/0144963 | A1 * | 5/2018 | Refai-Ahmed | H01L 24/83 |
| 2020/0006190 | A1 | 1/2020 | Manninen et al. | |
| 2020/0152549 | A1 * | 5/2020 | Joshi | H05K 7/20927 |
| 2020/0357660 | A1 * | 11/2020 | Lee | H01L 21/4882 |
| 2021/0193558 | A1 * | 6/2021 | Miele | H01L 23/4006 |
| 2022/0037270 | A1 * | 2/2022 | Wei | H01L 23/66 |
| 2022/0053634 | A1 * | 2/2022 | Zhou | H05K 7/20318 |
| 2022/0102241 | A1 * | 3/2022 | Joshi | H01L 24/48 |
| 2022/0142013 | A1 * | 5/2022 | Zhou | H05K 7/20927 |
| | | | | 361/702 |
| 2022/0142017 | A1 * | 5/2022 | Zhou | H05K 7/20318 |
| | | | | 361/700 |

FOREIGN PATENT DOCUMENTS

| | | | | |
|---|---|---|---|---|
| KR | 101751108 | B1 * | 11/2016 | ............ H01L 33/64 |
| WO | WO-2012171797 | A1 * | 12/2012 | ............ H01L 23/36 |
| WO | 2014089933 | A1 | 6/2014 | |
| WO | 2020146204 | A1 | 7/2020 | |

* cited by examiner

SYSTEMS INCLUDING A POWER DEVICE-EMBEDDED PCB DIRECTLY JOINED WITH A COOLING ASSEMBLY AND METHOD OF FORMING THE SAME

TECHNICAL FIELD

The present disclosure generally relates to heat transfer components and, more specifically, to substrates having embedded power devices that are coupled to cooling components.

BACKGROUND

Power control units (PCUs) include power cards having power devices, cooling device(s), gate drivers, a printed circuit board (PCB), capacitors, and other components. A component of the PCU is a power card, which contains power devices that may be switched on and off in high frequency during operation of a vehicle, for example. These power devices may generate significant amounts of heat. Conventional power cards have designs for exposing surface area of the power devices for cooling purposes. Some PCU configurations include power cards that are sandwiched within liquid cooled units to maintain a proper temperature while they switch on and off, as the switching generates heat. Furthermore, the power cards are connected to the driver board through pin connections. Such power cards may be mounted to a driver board via pins and may extend a distance from the driver board, leading to a larger volume profile, which includes a small power density and a high system loop inductance, resulting in a high power loss, especially at high switching frequencies. Improvements within the PCU structure are desirable to improve the power density and cooling of the PCU.

SUMMARY

In one aspect, a system includes a power device embedded PCB stack, a cooling assembly including a cold plate having one or more recesses therein, and a buffer cell disposed within each of the one or more recesses. The cooling assembly is bonded to the PCB stack with a insulation substrate disposed therebetween. The cooling assembly is arranged such that the buffer cell faces the PCB stack and absorbs stress generated at an interface of the PCB stack and the cooling assembly.

In another aspect, system includes a power device embedded PCB stack and a cooling assembly including a cold plate having one or more recesses therein that are configured to receive a buffer cell. The cooling assembly is bonded to the PCB stack via nanowire bonds such that an insulation substrate is disposed between the cooling assembly and the PCB stack.

In yet another aspect, a method of forming a cooling system includes bonding a stress buffer cell to a cold plate within a recess of the cold plate and joining a power device embedded PCB stack to the cold plate using an insulation substrate disposed between the PCB stack and the cold plate. The stress buffer cell faces the power device PCB stack to absorb stress generated at an interface of the PCB stack and the cold plate.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
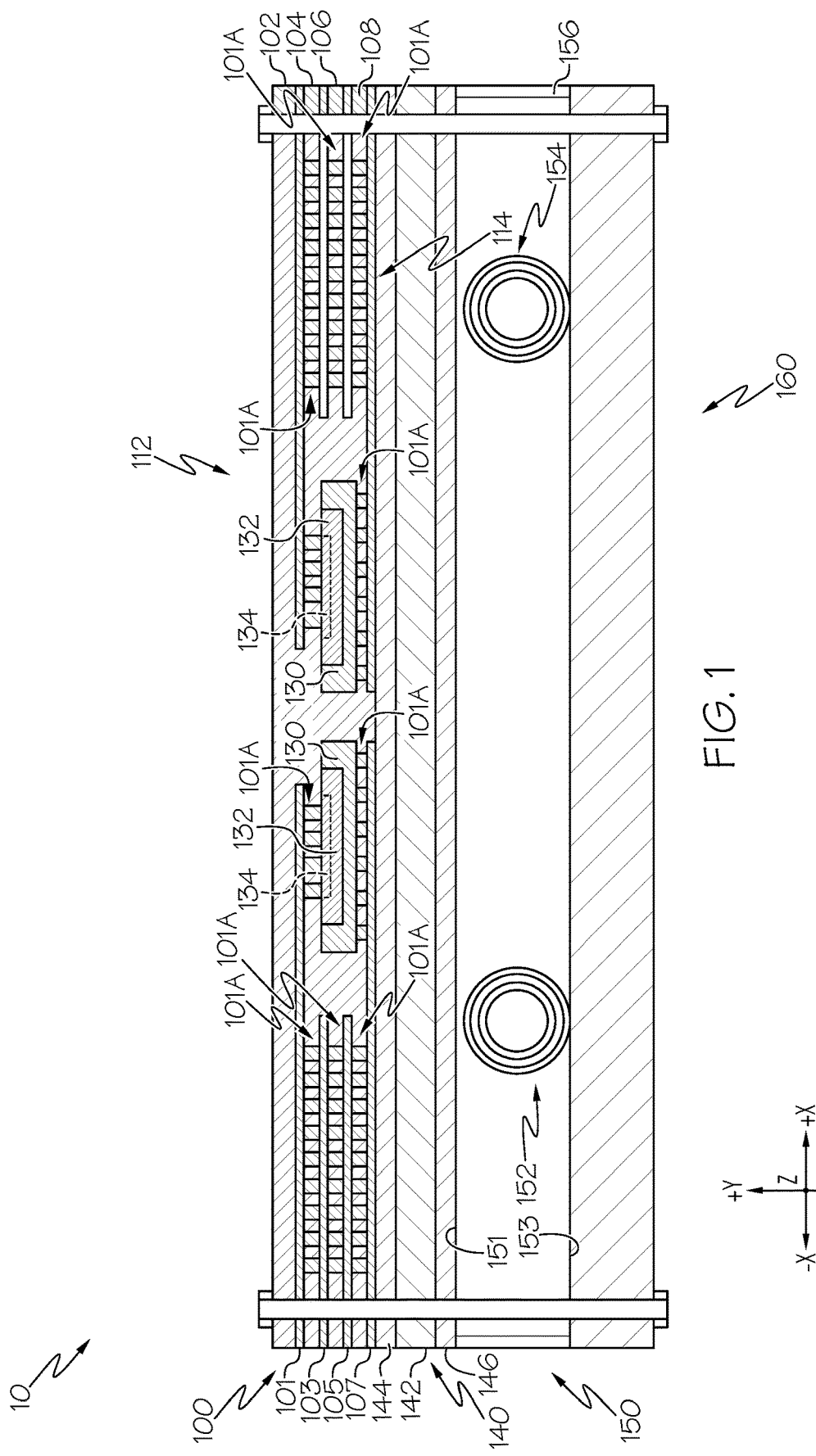
FIG. 1 schematically depicts a cross-sectional side view of an illustrative cooling system including a multi-layer printed circuit board (PCB) stack with a plurality of embedded power devices, an electrical insulation layer, a cold plate, and a capacitor according to one or more embodiments shown and described herein.

The devices described herein generally relate to cooling systems that include power devices (e.g., embedded power semiconductor devices) bonded (e.g., via direct bonded) to cooling assemblies that incorporate cold plates therein. The embedded power devices shown and described herein may utilize copper layers, pre-impregnated ("pre-preg") layers, and/or copper vias to form an inverter topology, a convertor topology, or a similar topology. Various configurations are shown and described herein. One or more of the copper layers and pre-preg layers are formed to be bonded to the cold plate, which is configured to thermally couple an embedded power device positioned adjacent to a first copper layer through one or more pre-preg layers and additional copper layers to the cold plate to facilitate improved heat transfer and heat spreading relative to traditional configurations. Although reference may be made to the conductive substrates being made of copper, it should be understood that a variety of conductive materials may be used in place of or in combination with copper.

Each structure shown and described herein provides advantages over traditional topologies (e.g., surface mounted power device topologies) because of the location and configuration of particular components. For example, the power device embedded substrates described herein provide smaller system volumes, lighter system weights, higher system power densities (e.g., power modules that include power device embedded PCBs are configured to operate at 40 kilowatts (kW) or more), lower overall inductances that deliver smaller switching losses, particularly at high switching frequency, overall lower cost, and/or more easily fits into new and unique locations within a vehicle (e.g., within wheels or the like).

Furthermore, embodiments described herein propose various embedded power semiconductor devices within a substrate. The topologies further provide improved cooling of the system by reducing and/or eliminating thermal resistance layers between the power semiconductor devices and coolers such as vapor chambers and/or cooling assemblies. Another challenge, which is described in more detail herein, is the inability of bulk thermally conductive materials (e.g., copper layers and/or copper substrates embedded within the PCB stack) to efficiently increase the spread of heat over a surface area. That is, bulk thermally conductive materials may efficiently transport heat through a thickness of the bulk thermally conductive material (e.g., in longitudinal directions), but they do not efficiently spread heat from a source across a large area in a comparable way as vapor chambers can spread heat across large areas and transport heat through thicknesses of material. For example, a vapor chamber that receives heat generated by the power device can spread the heat over a larger effective area than a bulk thermally conductive material having dimensions similar to those of the vapor chamber. By improving heat spreading as well as heat transportation, devices can maintain lower running temperatures and the thickness of the bulk thermally conductive materials may be reduced within embedded power systems. Embodiments shown and described herein may also reduce and/or eliminate the external electrical isolation layer and/or grease layer and provide a more direct and improved thermal conductive path for removing heat from a power semiconductor device.

Traditional power device embedded PCB configurations utilize the electrical conductive properties of the copper substrates to connect to the power devices through a second surface, for example, the bottom of the copper substrates via vias. However, since the copper substrates are coupled via one or more vias, the thermal conductance from the power devices and the copper substrates is reduced since an externally attached cooling assembly and/or vapor chamber may not be bonded directly to the copper substrates, but rather to the power devices through vias and one or more copper layers used to electrically couple and control the power devices. That is, due to power layers connecting to the power devices from a first surface and a second surface, opposite the first surface, of the power device, vias are needed and thus restrict thermal conduction from the copper substrates and the corresponding power devices.

Further, the power device embedded PCB may be formed as part of an intelligent power module (IPM) in a stack configuration whereby the power device embedded PCB is adjacent to a first major surface of a cold plate with an electrical insulation layer and one or more grease layers therebetween. The electrical insulation layer is sandwiched between the power device embedded PCB and the cold plate to avoid any short circuit issues. Further, the grease layers are added on the two sides of the electrical insulation layer to provide thermal contact. In addition, the stack includes a capacitor pack coupled to a second major surface opposite the first major surface. Each of the components in the IPM may have through holes or the like such that the stack can be bolted or otherwise fixed together in the stack configuration. The cold plate provides cooling to both the power device embedded PCB and the capacitor pack.

Accordingly, traditional power device embedded PCB configurations connect an electrical insulation layer via one or more grease layers to a cooling assembly and optionally another electronic device such as a power capacitor that needs to be cooled. Other traditional embodiments connect an electrical insulation layer via one or more grease layers to an externally attached vapor chamber and/or a cooling assembly and optionally another electronic device such as a power capacitor that needs to be cooled.

Such traditional power device configurations may have potential issues with respect to thermal management, such as, for example, the PCB, in being bolted together with the insulation layer and cold plate by bolts at the corners, causes difficulties in ensuring very thin uniform grease layer because of the non-rigidity of the PCB relative to metal. Due to the high heat flux from the power devices and poor heat spreading within the PCB by the thin patterned copper layer, the grease layer contributes to the total thermal resistance from the device to the coolant. Another issue realized by the traditional power device configurations is the thermal deformation of the PCB during operation and the shape of the patterned copper layer causes grease to be pumped out, which deteriorates the heat transfer path through the thermal interface (TIM) material. Yet another issue realized by the traditional power device configurations is that the copper pattern on the bottom of the PCB includes a plurality of dimples that result from the electroplating of the copper vias. While a longer deposition time can minimize the size of the dimples, such a process is costly. These dimples may trap some air during assembly, which can further increase the thermal resistance.

Some previously developed solutions to the above-mentioned issues, such as direct bonding the power device embedded PCB, electrical insulation, and cold plate via bonding solutions that provide bonding and electrical insulation function, such as, for example, thermal conductive adhesives, polyimide films, and/or the like. However, the thermal conductivity of such insulation materials are typically low (e.g., 4-6 W/(mK) for thermal conductive adhesives and 0.25-0.5 W/(mK) for polyimide films). These bonding solutions would lead to a temperature difference of from about 65 K to about 165 K at the power level of the PCB design, which is 253 W/device heat from the embedded power device.

Use of ceramic as electrical insulation is one option for addressing the issues noted above. However, a large coefficient of thermal expansion (CTE) mismatch between copper pattern of the PCB, ceramic, and aluminum heat sink causes typical direct bonding techniques between the three to be challenging.

Embodiments according to the present disclosure provide electronic assembly configurations that improve thermal conductivity of the power devices embedded in the substrates. In particular, some embodiments implement a direct bonded insulation device such as a direct bonded copper substrate, a direct bonded aluminum device, or an active metal bonding substrate to the power semiconductor device embedded in the PCB at a first surface and directly to a heat sink at a second surface opposite the first surface.

As shown and described herein, new implementations of cooling assemblies directly bonded to power device embedded PCBs are disclosed. Turning now to the drawings wherein like numbers refer to like structures, and particularly to FIG. 1, a perspective view of an illustrative cooling system 10 including a multi-layer printed circuit board (PCB) stack 100 with a plurality of embedded power devices. In general, the PCB stack 100 includes a plurality of substrate layers 101, 103, 105, 107 such as copper, gold, silver, aluminum or an alloy thereof interspersed by pre-preg layers 102, 104, 106, 108, respectively. The plurality of substrate layers 101, 103, 105, 107 and pre-preg layers 102, 104, 106, 108 may be laminated together. Processes such as etching, milling, laser drilling, and the like may be implemented to create electrical connections within a substrate layer, vias between substrate layers, recesses for receiving embedded components and power devices 132 or power device stacks.

As depicted in FIG. 1, the cooling system 10 includes a cooling assembly 150 coupled to the PCB stack 100 with an insulation substrate 140 disposed therebetween. The cooling assembly 150 and the PCB stack 100 may be bonded together with the insulation substrate 140 using any conventional bonding technique, such as, for example, sintering, soldering, brazing, TLP, or similar binding process. In some embodiments, the insulation substrate 140 may be omitted, with the cooling assembly 150 and the PCB stack 100 being directly bonded to one another using any of the above-mentioned conventional bonding techniques.

The power device embedded PCB substrate 110 includes a first major surface 112 (e.g., a top surface, facing the +Y direction of the coordinate axes of FIG. 1) opposite a second major surface 114 (e.g., a bottom surface, facing the −Y direction of the coordinate axes of FIG. 1). The first major surface 112 may be, for example, a pre-preg layer 102 of the PCB stack 100. The second major surface 114 may be, for example, a substrate layer 107 of the PCB stack 100. As shown and described in more detail herein, the cooling assembly 150 is bonded to the second major surface 114 with the insulation substrate 140 disposed between the cooling assembly 150 and the second major surface 114 of the power device embedded PCB substrate 110. In some embodiments, the additional substrate layers 103, 105, 107 and pre-preg layers 104, 106, 108 are laminated between the first major surface 112 and the second major surface 114. The additional substrate layers maybe one or more power conductive layers for electrically coupling to the one or more power devices of the one or more power device stacks. In some embodiments, the additional substrate layers may include one or more active or passive components electrically coupled thereto. Illustrative embodiments of the embedded cooling system will be described in more detail herein. Additionally, methods for forming the embedded cooling system will also be described in herein.

Before turning to detailed embodiments of the present disclosure, a brief discussion of the PCB stack 100 and the associated heat conduction is provided. FIG. 1 depicts an illustrative 6-layer PCB stack 100 according to one or more embodiments shown and described herein. While a 6-layer PCB stack 100 is depicted, this is merely an example. PCB stacks 100 may include more or fewer layers. In general, PCB stacks 100 include multiple layers laminated to each other. For example, the layers may include conductive substrate layers 101, 103, 105, 107 and electrical insulating layers 102, 104, 106, 108 disposed between the conductive substrate layers 101, 103, 105, 107. In some embodiments, the electrical insulating layers 102, 104, 106, 108 may be formed in one or multiple layers. For example, pre-preg layers 102, 104 may be formed in a plurality of separate layers such that power devices 132, substrates (e.g., made of copper, aluminum, gold, silver, metal alloys and other thermally and/or electrically conductive materials) and/or other components (e.g., vapor chambers) may be embedded within the pre-preg layers. Additionally, thermal and/or conductive vias 101A, for example, copper vias or the like, may interconnect one or more conductive substrate layers 101, 103, 105, 107 providing paths for electrical signals and/or thermal conductance between components and layers therein.

The conductive substrate layers may be made of copper, aluminum, gold, silver, metal alloys thereof, and other electrically conductive materials. The electrical insulating layers 102, 104, 106, 108 may be laminates also known as pre-preg materials. For example, such materials may include cloth or fiber material combined with a resin material, where the cloth to resin ratio determines a laminate type designation (e.g., FR-4, CEM-1, G-10, etc.) and therefore the characteristics of the laminate produced. A variety of materials having dielectric properties include polytetrafluoroethylene (Teflon), FR-4, FR-1, CEM-1 or CEM-3. Other pre-preg materials used in the PCB industry are FMeiR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester).

Figure 2:
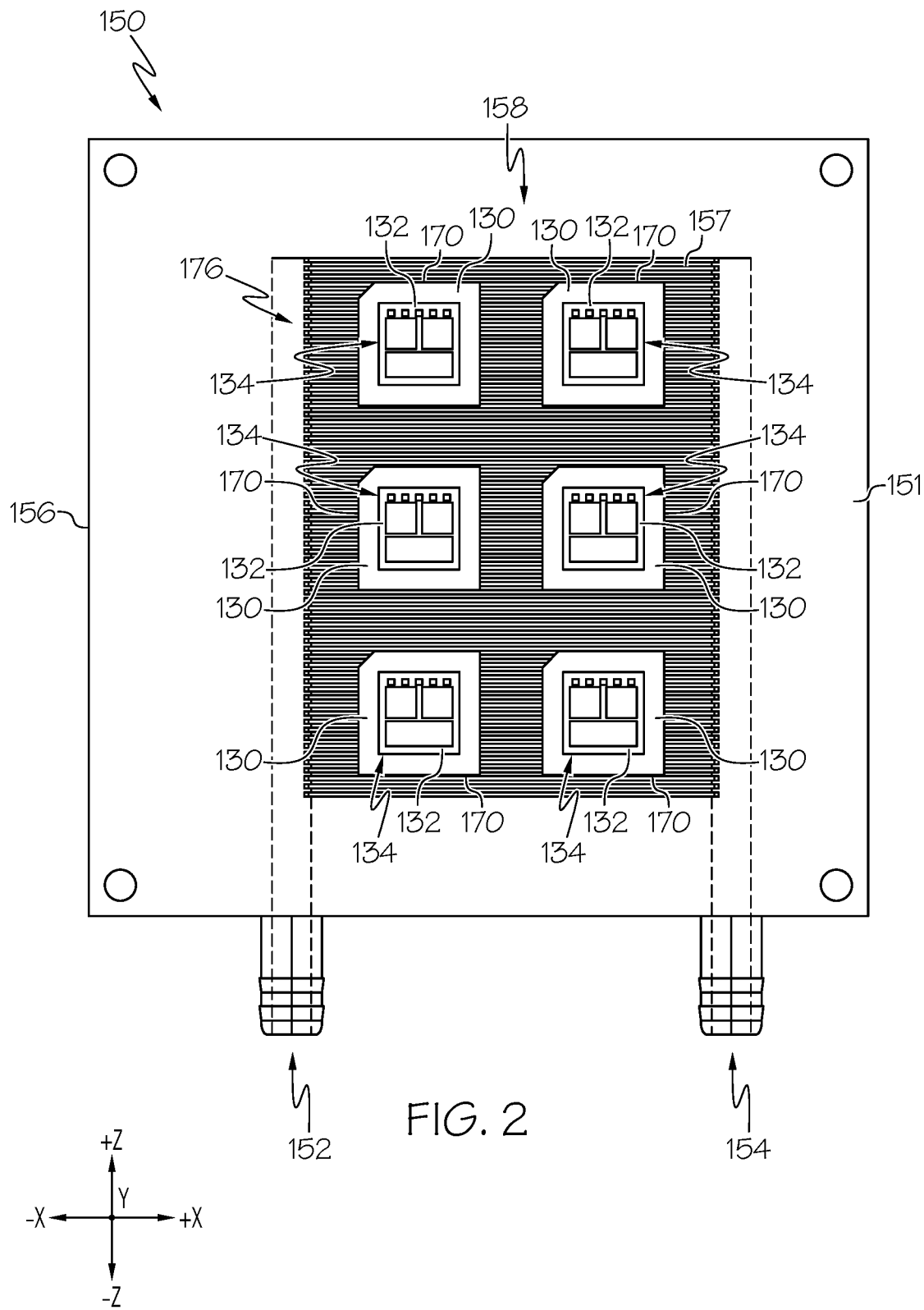
FIG. 2 depicts a top view of an illustrative cooling assembly and a plurality of embedded power devices (with the other portions of the PCB stack removed for ease of visualization) arranged on the cooling assembly according to one or more embodiments shown and described herein.

Referring to FIGS. 1 and 2, the power devices 132 may be bonded to a substrate 130 (e.g., a copper substrate) using silver sintering or other bonding techniques such as TLP bonding or the like. The substrate 130 may be defined by a length, a width, and a thickness. In some embodiments, the power device 132 is bonded within a cavity in the substrate 130 configured to receive the power device 132. In other embodiments, the power device 132 is bonded to a surface of the substrate 130. In some embodiments, the substrate 130 may be referred to as a Cu S cell.

The power devices 132 and any others depicted and described herein may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, at least one of the plurality of power devices 132 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the plurality of power devices 132 may operate within a power module having a high current and/or a high power (for example, greater than or equal to 5 kW, 10 kW, 20 kW, 30 kW, 40 kW, 50 kW, 60 kW, 70 kW, 80 kW, 90 kW, 100 kW, 110 kW, 120 kW, 130 kW, 140 kW, or 150 kW or any value therebetween) and under high temperatures (for example, in excess of 100° C., 150° C., 175° C., 200° C., 225° C., or 250° C.) and generate a large amount of heat that must be removed for the continued operation of the power module (including the power devices 132).

Traditional embodiments of power modules including the embedded power devices 132 cannot handle the heat generated by high power semiconductor devices because the thermal conductance paths from the power semiconductor device to cooling devices have undesirable thermal resistances. These thermal resistances are the result of small isolated paths such as vias used for electrical power delivery, which are configured between one or more conductive layers that prohibit the ability for more direct bonding of a cooling assembly to a direct bonding layer and thus a low thermal resistance path. However, present embodiments utilize the cooling assembly 150 directly bonded to the PCB stack 100 in which the power devices 132 are embedded. Such a configuration allows for more efficient and effective heat spreading and heat transfer from the power modules including the power devices 132, as described herein. The plurality of power devices 132 may be controlled by a gate drive device (not shown) in the power device embedded PCB substrate 110 to change a current type between an alternating current to a direct current, for example.

Still referring to FIGS. 1 and 2, the power device 132 includes a portion referred to as an active area 134, which, in some embodiments, may be located in a center of the power device 132. The active area 134 of a power device 132 refers to the portion of the power device 132 where all or a significant amount of heat is generated. The heat may be a result of transistor switching, internal resistance, and/or the like. The active area 132 may be positioned such that it is aligned with stress buffer cells embedded within a cold plate of the cooling assembly 150, as particularly depicted in FIG. 2 and described in greater detail herein.

Still referring to FIGS. 1-2, the heat generated by the active area 134 is conducted through the power device 132 and into the substrate 130 (e.g., copper) from the active area 134 downwards (e.g., generally in the −Y direction of the coordinate axes of FIG. 1) at about a 45 degree angle. That is, the substrate 130 (e.g., made of copper) may be good at conducting heat from the active area 134 of the power device 132, but the effective area for heat transfer by the substrate is much smaller than the actual size of the substrate 130. Therefore, heat management within a PCB having embedded power devices may be improved by improving not only heat transfer through the PCB from the power device 132 to the cooling assembly 150, but more so by improving heat spreading from an active area of a power device 132 such that the effective area for cooling is increased within the PCB stack.

Referring again to FIG. 1, in some embodiments, the PCB stack 100 is bonded to the cooling assembly 150 via the insulation substrate 140. The insulation substrate 140 may generally be any type of thermally conductive but electrically insulative material or layers of material now known or later developed, such as, for example, an insulated metal substrate, or a direct bonded copper (DBC) substrate. In some embodiments, the insulation substrate 140 may have a one piece construction with one side being patterned in a manner that is the same as the second major surface 114 of the PCB stack 100. In other embodiments, the insulation substrate 140 may be comprised of a plurality of separate pieces, such as, for example, for areas at different voltages. In the embodiment depicted in FIG. 1, the insulation substrate 140 may be a multi-component DBC substrate that includes a ceramic layer 142 that is at least partially coated with one or more first copper layers 144 on a first side thereof and one or more second copper layers 146 on a second side thereof. Such embodiments of DBC are generally understood and are not described further herein. In still other embodiments, the insulation substrate 140 may be omitted such that the PCB stack 100 is directly bonded to the cooling assembly 150.

Still referring to FIG. 1, the cooling assembly 150 is generally configured to provide cooling to the components within the PCB stack 100, particularly the power devices 132 embedded therein. As such, a first major surface 151 of the cooling assembly 150 is bonded to the PCB stack 100 via the insulation substrate 140 such that the cooling assembly 150 is thermally coupled to the components of the PCB stack 100. In some embodiments, the cooling assembly 150 may also be configured to provide cooling to a capacitor pack 160. As such, as depicted in FIG. 1, a second major surface 153 opposite the first major surface 151 of the cooling assembly 150 is coupled to the capacitor pack 160. It should be appreciated that the capacitor pack 160 may be omitted in some embodiments. As capacitors are generally understood, the capacitor pack 160 is not discussed further herein.

Figure 3:
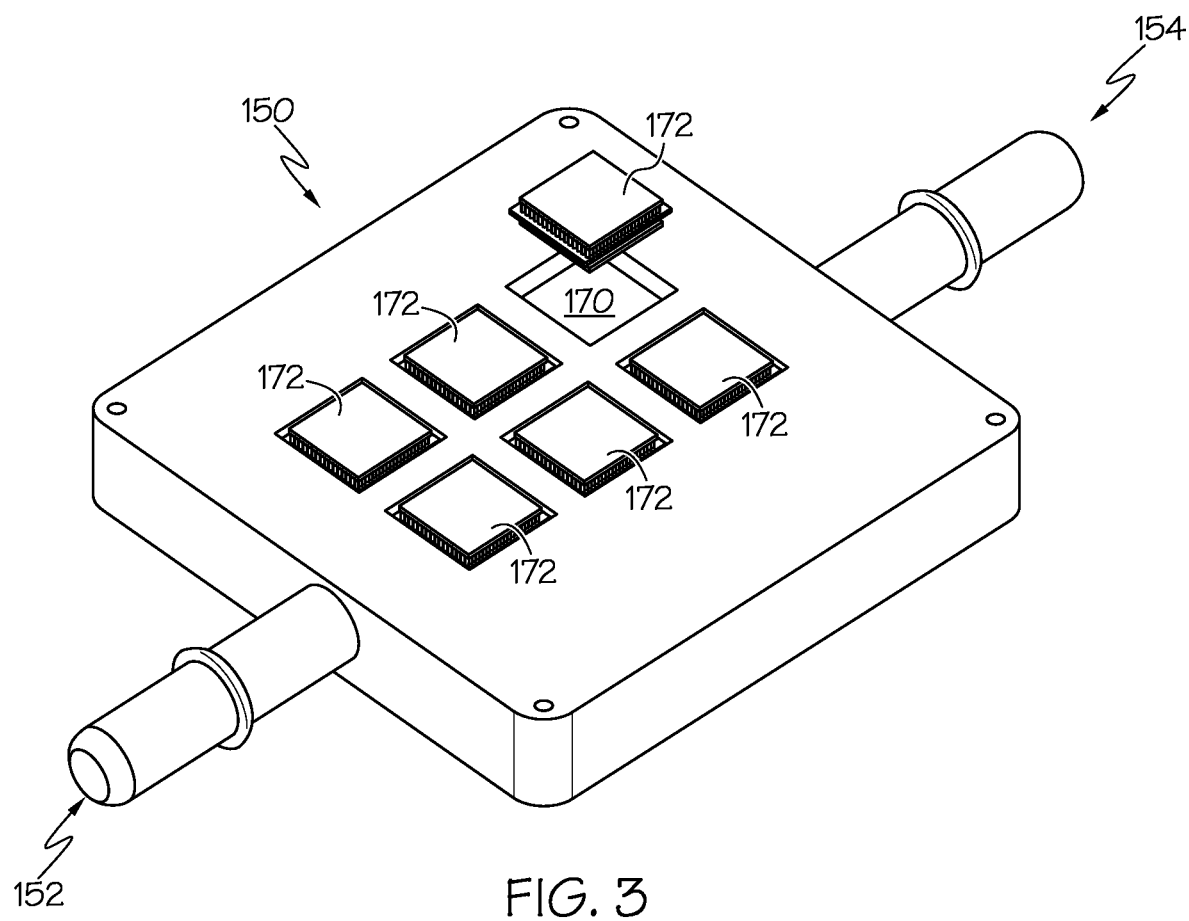
FIG. 3 depicts a top perspective view of another illustrative cooling assembly according to one or more embodiments shown and described herein.

Referring to FIGS. 1-3, the cooling assembly 150 generally includes at least one fluid inlet 152, at least one fluid outlet 154, a cooling manifold 156, and a cold plate 158. In some embodiments, the cooling assembly 150 may further include a heat sink 176. The at least one fluid inlet 152 and the at least one fluid outlet 154 are configured such that cooling fluid may be introduced through the at least one fluid inlet 152 into a cavity of a cooling manifold 156. The cooling manifold 156 is particularly arranged within the cooling assembly 150 such that the cooling manifold 156 is in thermal contact with the power devices 132 of the PCB stack 100, thereby allowing heat transfer to occur with the heat generated by the power devices 132 at the cooling assembly 150. Specifically, the cooling fluid introduced via the at least one fluid inlet 152 flows through a cavity of the cooling manifold 156 such that the cooling fluid impinges on a surface of the cooling manifold 156 that contacts the PCB stack 100 and extracts heat therefrom (e.g., the cold plate 158). The cooling fluid may flow out of the cooling manifold 156 through the at least one fluid outlet 154 formed in the cooling assembly 150. While not depicted in the figures, the at least one fluid inlet 152 and the at least one fluid outlet 154 may be fluidly coupled to a pump, a condenser, a reservoir, a radiator, and/or other cooling system components.

While FIGS. 1 and 2 depict the at least one fluid inlet 152 and the at least one fluid outlet 154 each generally arranged substantially parallel to the cold plate 158 and extending out of one side of the cooling assembly 150 between the first major surface 151 and the second major surface 153 thereof, the present disclosure is not limited to such. That is, the at least one fluid inlet 152 and the at least one fluid outlet 154 may extend out of other surfaces of the cooling assembly 150 in some embodiments. Still further, while FIGS. 1 and 2 depict the at least one fluid inlet 152 and the at least one fluid outlet 154 extending out of the same surface of the cooling assembly 150, the present disclosure is not limited to such. That is, as depicted for example in FIG. 3, the at least one fluid inlet 152 may extend from a first surface of the cooling assembly 150 and the at least one fluid outlet 154 may extend from a second surface of the cooling assembly 150, such as, for example, an opposite surface of the cooling assembly 150.

Figure 4A:
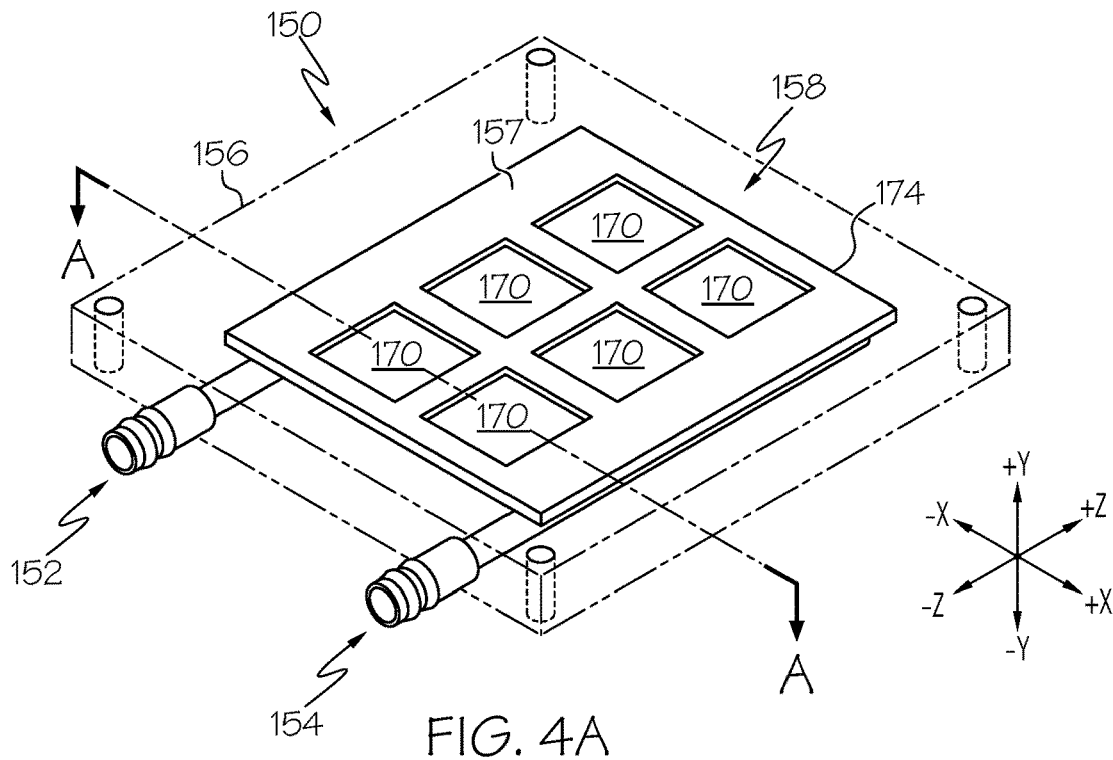
FIG. 4A depicts a top perspective view of an illustrative cooling assembly having a cold plate and a cooling manifold, the cooling manifold being transparent for viewing internal components according to one or more embodiments shown and described herein.
Figure 4B:
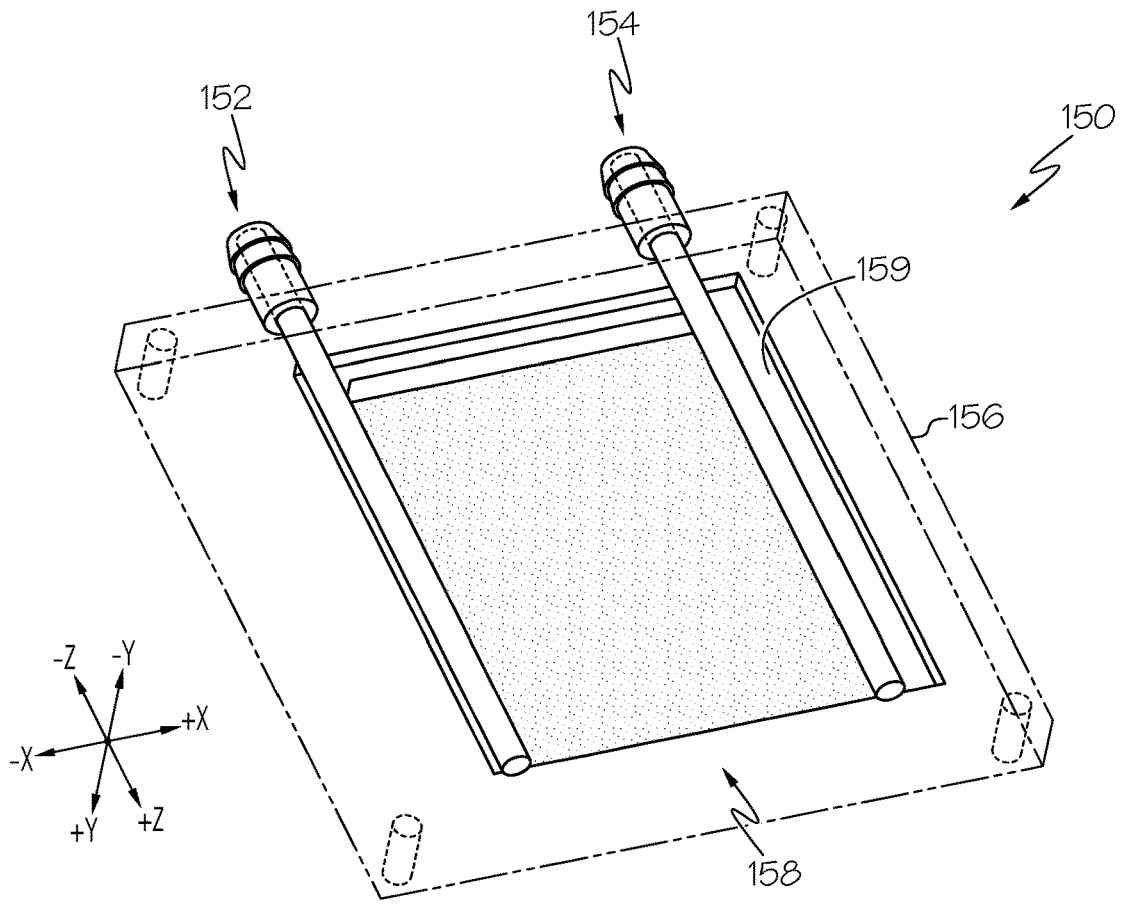
FIG. 4B depicts a bottom perspective view of an illustrative cooling assembly having a cold plate and a cooling manifold, the cooling manifold being transparent for viewing internal components according to one or more embodiments shown and described herein.
Figure 4C:
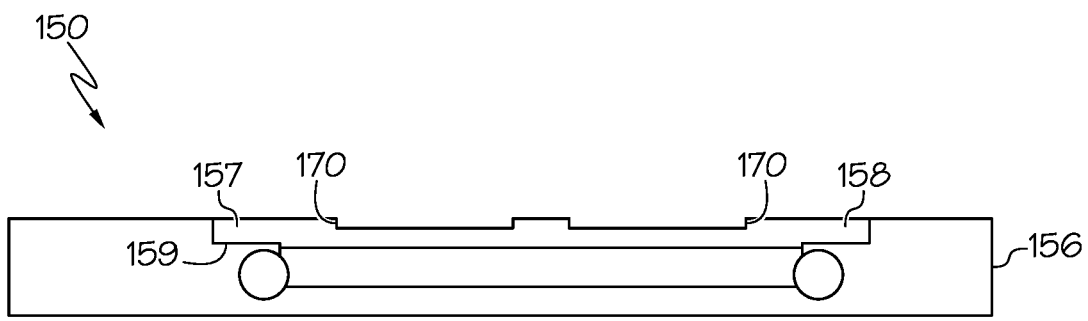
FIG. 4C depicts a cross-sectional side view of an illustrative cooling assembly taken along line A-A of FIG. 4A according to one or more embodiments shown and described herein.

Referring now to FIGS. 2, 4A, and 4C, in some embodiments, the first major surface 151 of the cooling assembly 150 is generally planar (e.g., extending in the X and Z directions of the coordinate axes of FIGS. 2, 4A, and 4C) and includes the cold plate 158 and at least a portion of the cooling manifold 156. That is, the cold plate 158, together with a portion of the cooling manifold 156, forms the first major surface 151 of the cooling assembly 150. Further, as particularly depicted in FIG. 4C, the cooling manifold 156 surrounds the cold plate 158 on all remaining sides (e.g., each side except for the portion of the cold plate 158 forming the first major surface 151 of the cooling assembly 150).

Referring to FIGS. 4A-4C, the cooling manifold 156 includes a fluid path or cavity formed therein such that the cold plate 158 and the heat sink can be received therein. The cooling manifold 156 may be made of a plastic or metal material. Accordingly, a bonding technique such as a metal-plastic direct bonding process may be used to bond the cold plate 158 to the cooling manifold 156 when it is made of plastic. In other embodiments, a sintering, soldering, brazing, TLP, or similar binding process may be used to bond the cold plate 158 to the cooling manifold 156 when the cooling manifold 156 is a metal or similar material.

As particularly depicted in FIG. 4C, the cold plate 158 includes a body 174 having a first major surface 157 and a second major surface 159 opposite the first major surface 157. The first major surface 157 of the cold plate 158 includes one or more cavities 170 formed therein. Such embodiments may allow for further minimization of the stress within the bonding package of the PCB stack 100 (FIG. 1), the insulation substrate 140 (FIG. 1) and the cooling assembly 150. Referring again to FIGS. 2, 4A, and 4C, the one or more cavities 170 are generally shaped and sized to hold a stress buffer cell 172, as particularly depicted in FIG. 3. The stress buffer cell 172 will be discussed hereinbelow. While FIGS. 2, 3, and 4A depict the first major surface 151 of the cooling assembly 150 including a cold plate 158 with six (6) cavities therein such that the cold plate 158 is capable of holding six (6) stress buffer cells 172, the present disclosure is not limited to such. That is, greater or fewer cavities 170 may be formed within the cold plate 158 without departing from the scope of the present disclosure. In some embodiments, the number of cavities 170 (and thus the number of stress buffer cells 172 disposed therein) may correspond to the number of electronic components embedded in the PCB stack 100 (FIG. 1). For example, each stress buffer cell 172 may correspond in shape, size, and/or location to a power device 132, and more specifically, to the active area 134 thereof held by the substrate 130 (e.g., a Cu S cell) disposed within the PCB stack 100 (FIG. 1), as shown in FIG. 2 (e.g., the substrate 130 that holds the power device 132 is covering an entirety of the stress buffer cell 172, which is not shown). Further, while FIGS. 2, 3, and 4A depict the cold plate 158 having generally identically sized cavities 170 arranged in a 2×3 grid, the present disclosure is not limited to such. That is, other cavity sizes (e.g., all the same size and/or different sizes) and/or particular arrangements are contemplated and included within the scope of the present disclosure.

The materials used to form the cold plate 158 are generally not limited by the present disclosure. However, in some embodiments, to further minimize the CTE mismatch, the cold plate 158 may be constructed of copper-aluminum composite or some other composite, such as, for example, copper tungsten (WCu, CuW), molybdenum copper (MoCu, CuMo), and copper molybdenum copper (Cu/Mo/Cu). This not only reduces the CTE difference between the cold plate and DBC by 50% relative to other bonding technologies, but also provides for improved heat spreading. In some embodiments, the Al—Cu heat sink could cool the heat source (e.g., the power devices 132) to a lower temperature.

Figure 4D:
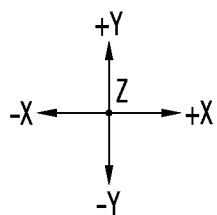
FIG. 4D depicts a perspective view of illustrative heat sink fins bonded to a surface of a cold plate within a cooling assembly according to one or more embodiments shown and described herein.
Figure 4D:
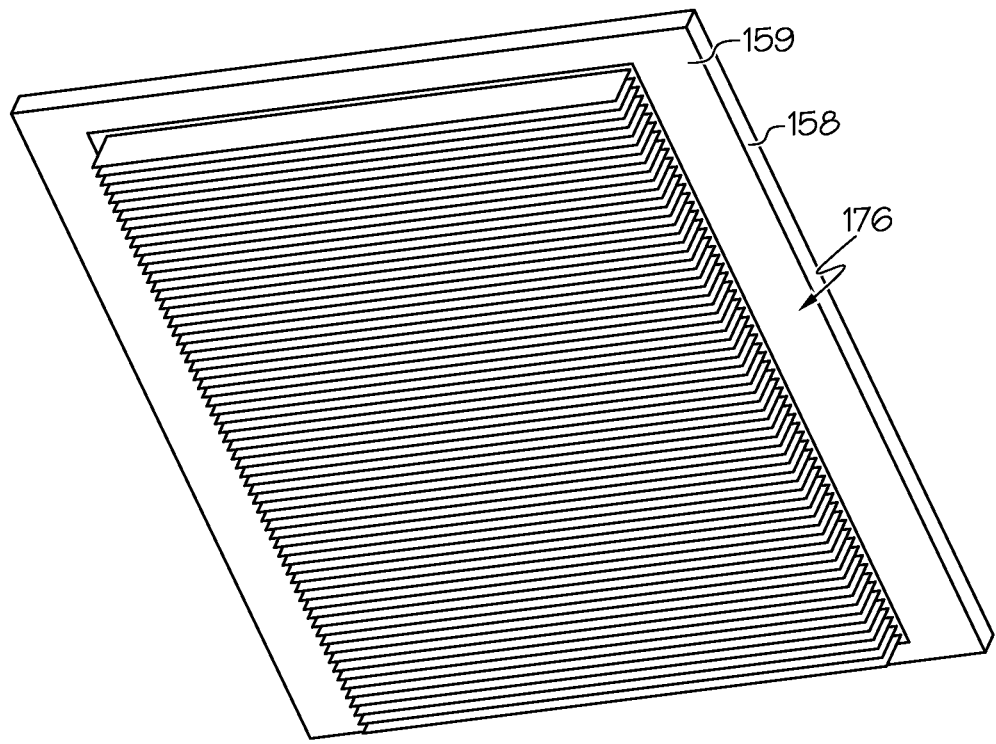

Referring to FIGS. 4B and 4D, the second major surface 159 of the cold plate 158 may include the heat sink 176 disposed thereon. In some embodiments, the heat sink 176 may be formed and bonded to the second major surface 159 of the cold plate 158. Various bonding techniques may be implemented to bond the heat sink 176 to the second major surface 159 of the cold plate 158. For example, metal to metal brazing, soldering, sintering, or other bonding processes may be implemented. In some embodiments, the heat sink 176 includes microchannels, plate fins, pin fins, or combination thereof. The heat sink 176 may be made of a thermally conductive material such as aluminum or copper. The heat sink 176 may be machined from a solid block of the thermally conductive material. In some embodiments, the heat sink 176 may be forged, extruded, or 3D-printed. In some embodiments, the heat sink 176 and the cold plate 158 may be formed from a single piece of thermally conductive material. In some embodiments, the heat sink 176 may extend away from the second major surface 159 of the cold plate 158 toward the second major surface 153 of the cooling assembly 150 (e.g., in the −Y direction of the coordinate axes of FIG. 4B).

As noted above, the cold plate 158 includes one or more cavities 170 formed within the first major surface 157 thereof, each cavity 170 shaped, sized, and arranged to receive a stress buffer cell 172 (FIG. 3) therein. The stress buffer cells 172 may be particularly formed for particular uses. For example, in some embodiments, the stress buffer cells 172 may each be shaped, sized, and/or configured to correspond to one or more components disposed within the PCB stack 100 (FIG. 1), such as the power devices 132 (FIG. 2) (e.g., IGBTs) disposed within the PCB stack 100 (FIG. 1). In some embodiments, the stress buffer cells 172 may be aligned with components disposed within the PCB stack 100 (FIG. 1), such as the power devices 132, particularly the active areas 134 thereof. For example, the stress buffer cells 172 may be aligned with the active areas 134 of the power devices 132 disposed within the PCB stack 100 (FIG. 1). The stress buffer cells 172 are generally shaped sized and/or configured to absorb at least a portion of the stress that is exerted on the insulation substrate 140 (FIG. 1) by the PCB stack 100 (FIG. 1) on one side (or the PCB stack directly in embodiments where the insulation substrate 140 (FIG. 1) is omitted) and the cooling assembly 150 on the other side. The stress buffer cells 172 may include various different configurations. For example, FIGS. 5A-5C depict one illustrative stress buffer cell 572 that is double sided, and FIGS. 6A-6C depict another illustrative stress buffer cell 672 that is single sided.

Figure 5A:
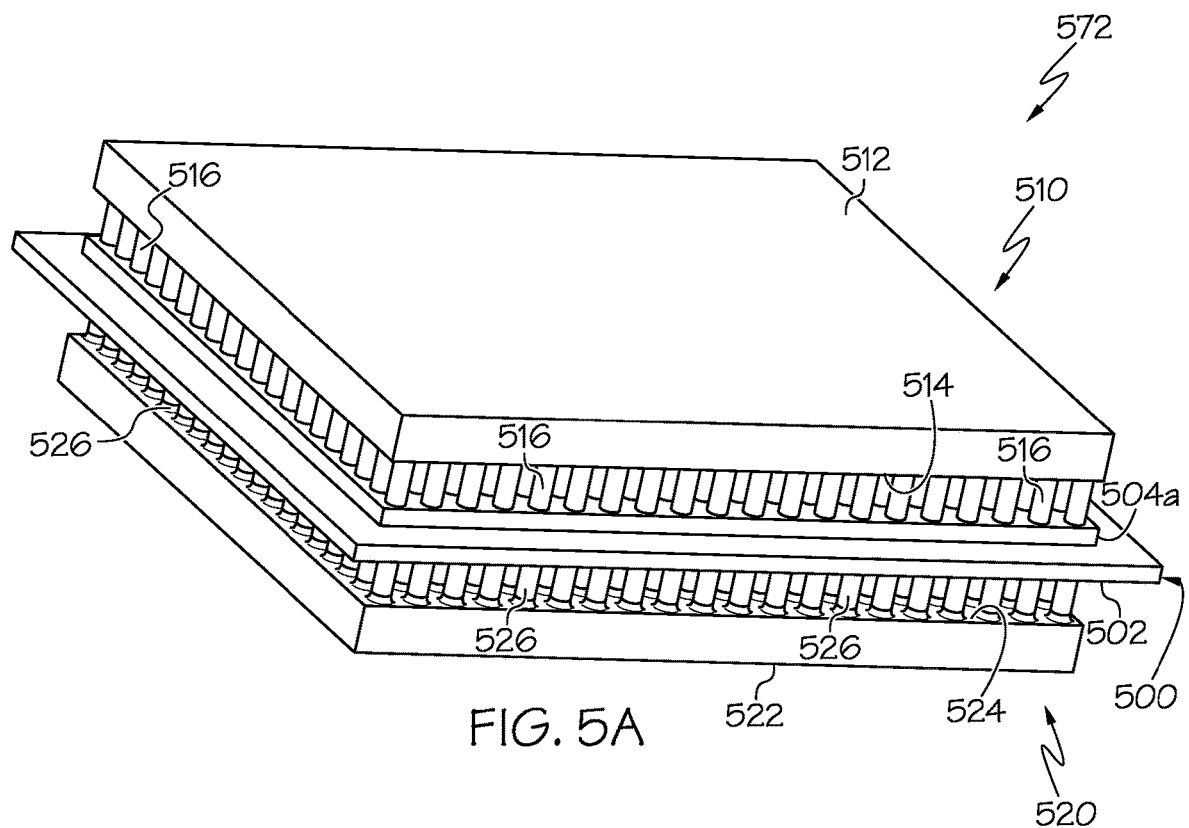
FIG. 5A depicts a side perspective view of an illustrative double sided stress buffer cell according to one or more embodiments shown and described herein.
Figure 5B:
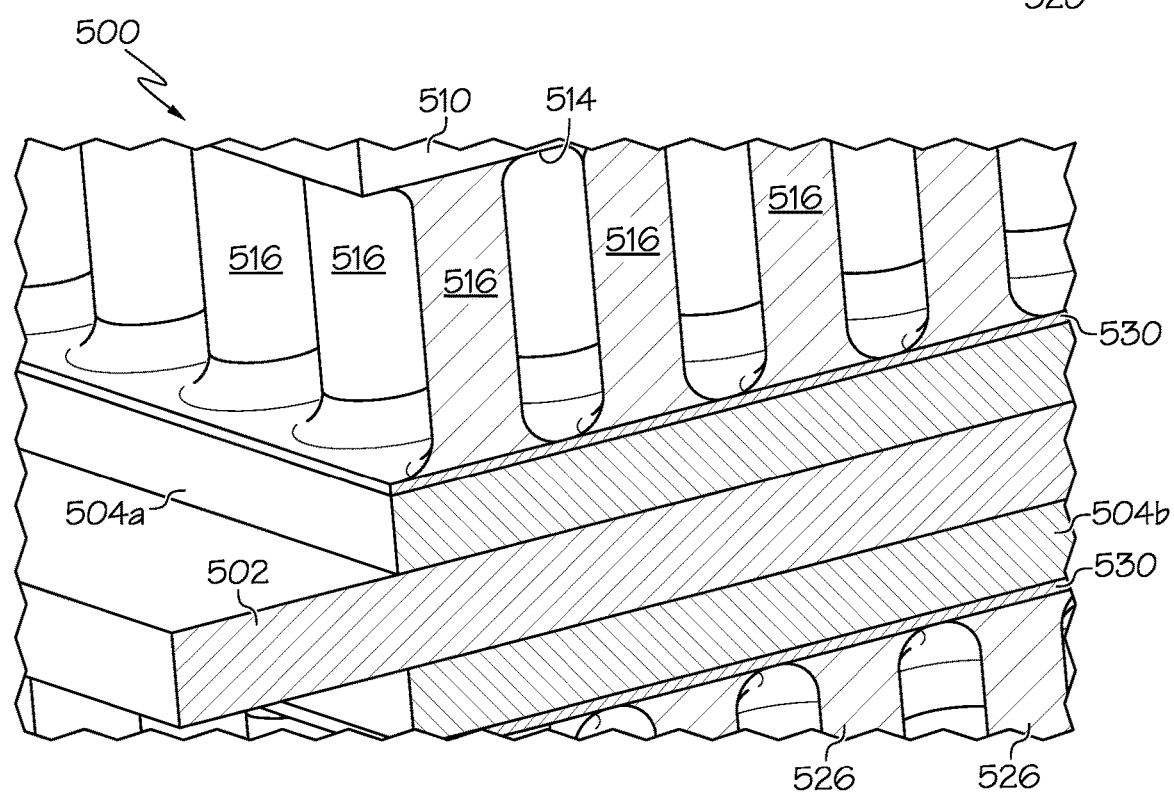
FIG. 5B depicts a detailed view of the components of the double sided stress buffer cell of FIG. 5A according to one or more embodiments shown and described herein.
Figure 5C:
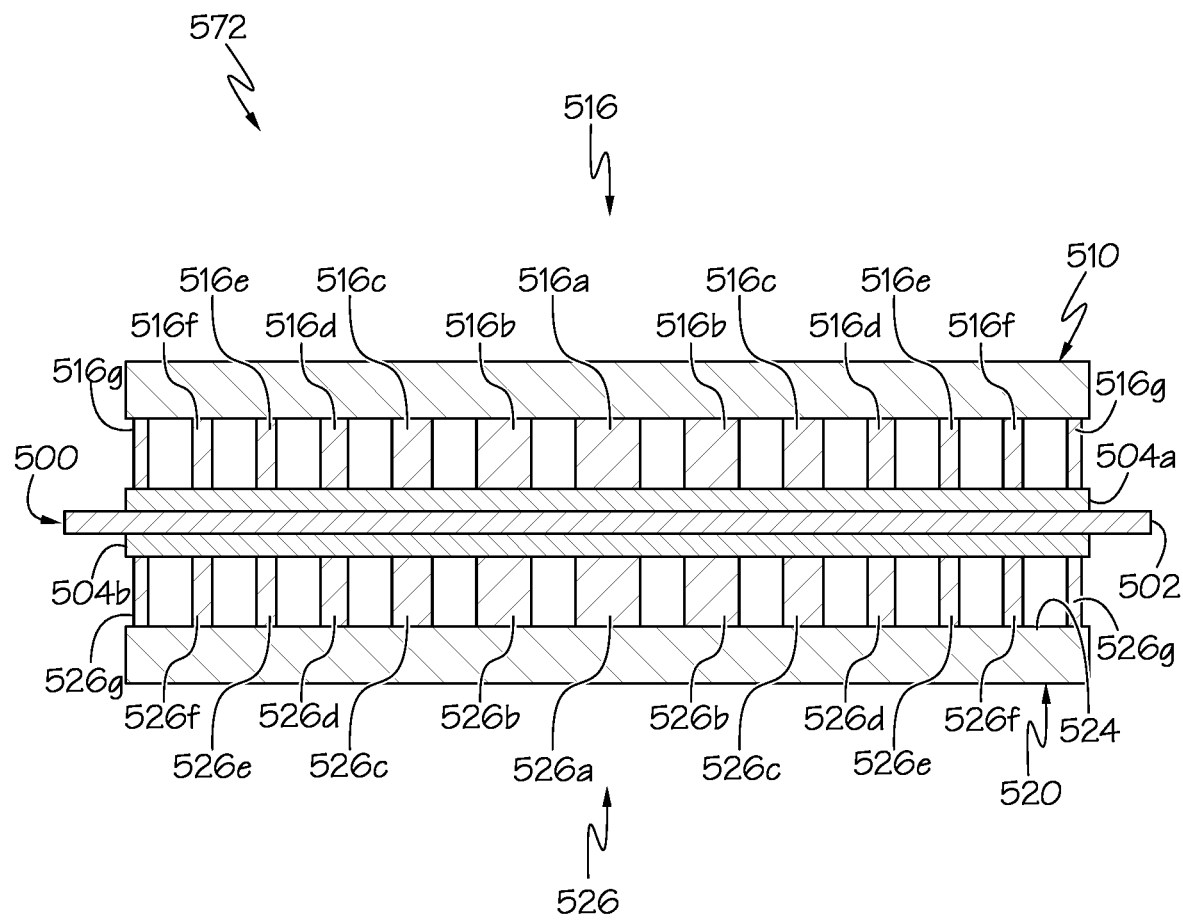
FIG. 5C schematically depicts a cross-sectional side view of an illustrative double sided stress buffer cell having functionally graded pin sizes according to one or more embodiments shown and described herein.
Figure 6A:
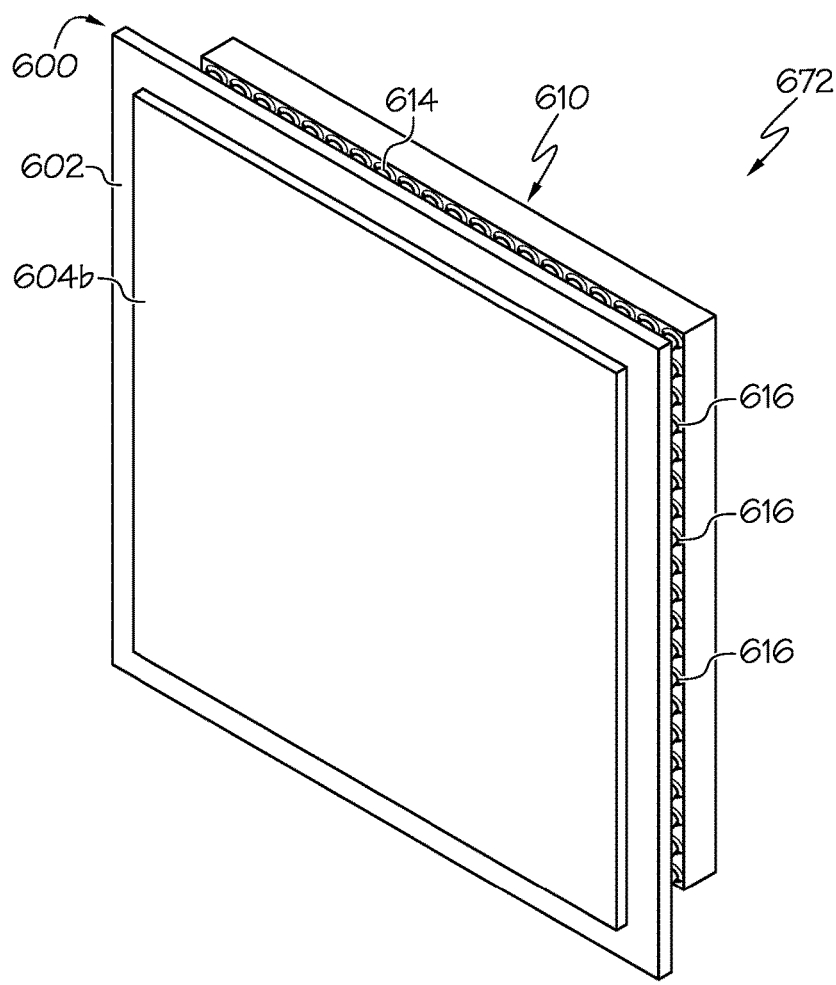
FIG. 6A depicts a side perspective view of an illustrative single sided stress buffer cell according to one or more embodiments shown and described herein.
Figure 6B:
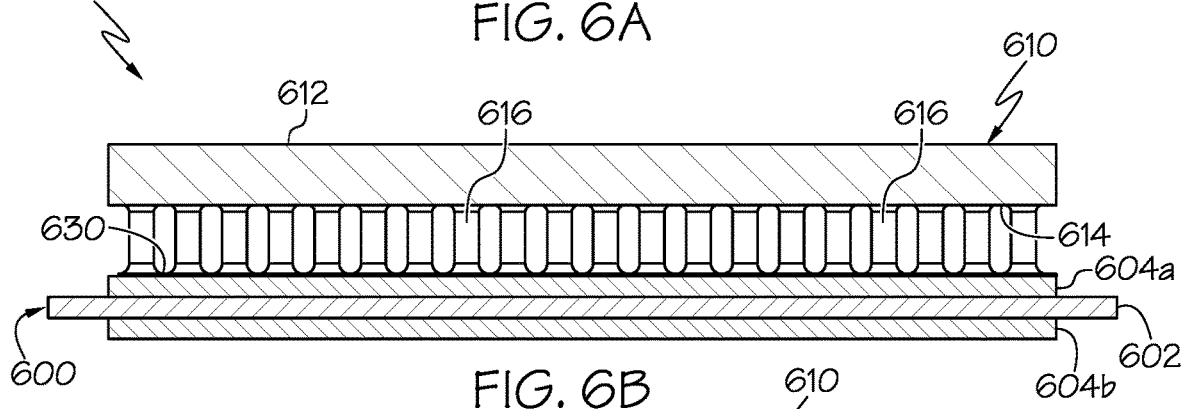
FIG. 6B depicts a cross-sectional side view of an illustrative single sided stress buffer cell having constant pin sizes according to one or more embodiments shown and described herein.
Figure 6C:
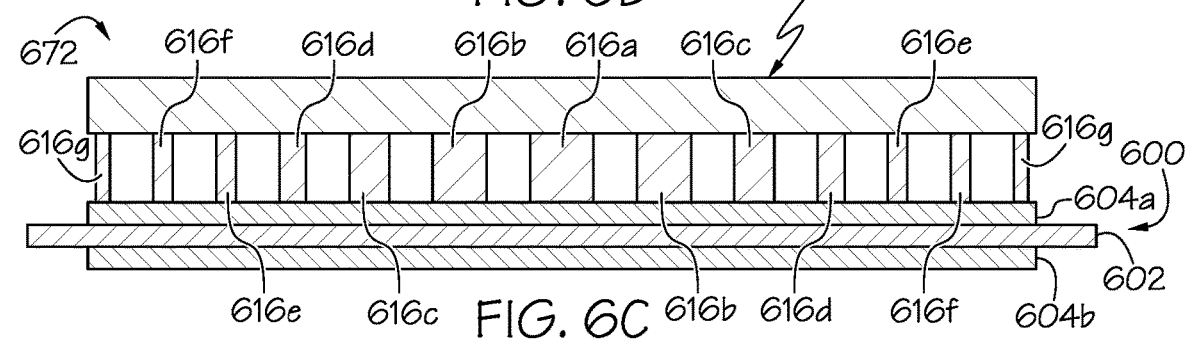
FIG. 6C depicts a cross-sectional side view of an illustrative single sided stress buffer cell having functionally graded pin sizes according to one or more embodiments shown and described herein.

Referring now to FIGS. 5A-5B, a double sided stress buffer cell 572 is depicted. The double sided stress buffer cell 572 generally includes a DBC stack 500 sandwiched between a first copper plate 510 and a second copper plate 520. The DBC stack 500 generally includes a ceramic layer 502 disposed between a first copper layer 504a and a second copper layer 504b (depicted in FIG. 5B). The ceramic layer 502 may be formed from Alumina ($Al_2O_3$), Aluminum nitride (AlN), Beryllium oxide (BeO), or the like.

In some embodiments, the ceramic layer 502 may generally have a larger footprint than the first copper layer 504a and the second copper layer 504b, as shown in FIGS. 5A and 5B. For example, one illustrative stress buffer cell may have a ceramic layer 502 that is about 17 mm long and 17 mm wide and both the first copper layer 504a and the second copper layer 504b are about 15 mm long and 15 mm wide such that the ceramic layer 502 extends a distance outwardly from the footprint of the first copper layer 504a and the second copper layer 504b when the ceramic layer 502, the first copper layer 504a, and the second copper layer 504b are arranged concentrically with one another. However, it should be appreciated that this is merely illustrative, and other dimensions (and relative sizes) are contemplated and included within the scope of the present disclosure.

The first copper plate 510 includes a first major surface 512 and a second major surface 514 opposite the first major surface 512. The first major surface 512 of the first copper plate 510 may be generally planar. The second major surface 514 of the first copper plate 510 may generally include a plurality of pins 516 extending therefrom (e.g., a pinned surface). In some embodiments, the plurality of pins 516 extending from the second major surface 514 of the first copper plate 510 may be integrated with the first copper plate 510 such that formation of the first copper plate 510 includes formation of the plurality of pins 516 extending from the second major surface 514 thereof. In other embodiments, the plurality of pins 516 may be separately formed and bonded to the second major surface 514 of the first copper plate 510. Each one of the plurality of pins 516 includes a proximal end that is defined by an interface between the plurality of pins 516 and the second major surface 514 of the first copper plate 510 and a distal end. The distal end of each one of the plurality of pins 516 is configured to be bonded to the first copper layer 504a of the DBC stack 500. For example, as particularly depicted in FIG. 5B, the plurality of pins 516 are bonded to the first copper layer 504a via a solder layer 530 disposed therebetween. However, it should be appreciated that other means of bonding the plurality of pins 516 to the first copper layer 504a are contemplated and included within the scope of the present disclosure, including those that utilize, for example, sintering, brazing, TLP, or similar binding processes. The shape and size of each one of the plurality of pins 516 is not limited by the present disclosure, and may be any shape and size. For example, in some embodiments, the plurality of pins 516 may be a plurality of nanowires similar to the nanowires described hereinbelow with respect to FIG. 7.

As depicted in FIG. 5A, the size of the first copper plate 510 is generally such that a footprint thereof corresponds to a footprint of the first copper layer 504a of the DBC stack 500. That is, the length and the width of the first copper plate 510 may generally correspond to a length and a width of the first copper layer 504a of the DBC stack 500. Such a corresponding size ensures that all of the pins 516 extending from the second major surface 514 of the first copper plate 510 can be bonded to the first copper layer 504a of the DBC stack 500. However, it should be appreciated that such relative shapes and sizes are merely illustrative, and other relative shapes and/or sizes are contemplated and included within the scope of the present disclosure.

Referring again to FIGS. 5A-5B, the second copper plate 520 includes a first major surface 522 and a second major surface 524 opposite the first major surface 522. The first major surface 522 of the second copper plate 520 may be generally planar. The second major surface 524 of the second copper plate 520 may generally include a plurality of pins 526 extending therefrom (e.g., a pinned surface). In some embodiments, the plurality of pins 526 extending from the second major surface 524 of the second copper plate 520 may be integrated with the second copper plate 520 such that formation of the second copper plate 520 includes formation of the plurality of pins 526 extending from the second major surface 524 thereof. In other embodiments, the plurality of pins 526 may be separately formed and bonded to the second major surface 524 of the second copper plate 520. Each one of the plurality of pins 526 includes a proximal end that is defined by an interface between the plurality of pins 526 and the second major surface 524 of the second copper plate 520 and a distal end. The distal end of each one of the plurality of pins 526 is configured to be bonded to the second copper layer 504b of the DBC stack 500. For example, as particularly depicted in FIG. 5B, the plurality of pins 526 are bonded to the second copper layer 504b via a solder layer 530 disposed therebetween. However, it should be appreciated that other means of bonding the plurality of pins 526 to the second copper layer 504b are contemplated and included within the scope of the present disclosure, including those that utilize, for example, sintering, brazing, TLP, or similar binding processes. The shape and size of each one of the plurality of pins 526 is not limited by the present disclosure, and may be any shape and size. For example, in some embodiments, the plurality of pins 526 may be a plurality of nanowires similar to the nanowires described hereinbelow with respect to FIG. 7.

As partially depicted in FIG. 5B and can be inferred from FIG. 5A, the size of the second copper plate 520 is generally such that a footprint thereof corresponds to a footprint of the second copper layer 504b of the DBC stack 500. That is, the length and the width of the second copper plate 520 may generally correspond to a length and a width of the second copper layer 504b of the DBC stack 500. Such a corresponding size ensures that all of the pins 526 extending from the second major surface 524 of the second copper plate 520 can be bonded to the second copper layer 504b of the DBC stack 500. However, it should be appreciated that such relative shapes and sizes are merely illustrative, and other relative shapes and/or sizes are contemplated and included within the scope of the present disclosure.

While FIG. 5A generally depicts the DBC stack 500, the first copper plate 510, and the second copper plate 520 as being generally concentric with one another, the present disclosure is not limited to such. That is, one or more of the DBC stack 500, the first copper plate 510, and the second copper plate 520 may be offset from at least one of the others of the DBC stack 500, the first copper plate 510, and the second copper plate 520. That is, for example, the first copper plate 510 may be offset by about a 0.005 mm displacement relative to the DBC stack 500 and/or the second copper plate 520 in some embodiments. Such a displacement may be considered acceptable because it results in a pin elongation of about 0.3% at a highest stress point. The pins 516, 526 are provided on the first copper plate 510 and the second copper plate 520 respectively such that stress can be absorbed by the pins 516, 526, thereby causing some deformation of the pins 516, 526. This reduces the stress applied to the bonding interface due to the thermal expansion difference of the two different materials with different CTE on either side of the bonding interface.

While FIGS. 5A-5B depict the pins 516, 526 as all generally having the same shape and size, the present disclosure is not limited to such. For example, as depicted in FIG. 5C, the various pins 516, 526 may be differently sized in a functionally graded distribution to absorb stress in instances where the stress is larger in radially outward locations (e.g., near the outer edges of the stress buffer cell 572). More specifically, as shown in FIG. 5C, first pins 516a, 526a are centrally located and have a relatively larger diameter. As the stress buffer cell 572 is traversed from the central location to the outer edges thereof, the pins 516b-516g and 526b-526g gradually shrink in diameter (e.g., when traversing outwards from pin 516a to pins 516g and when traversing outwards from pin 526a to pins 526g) such that the outermost pins 516g, 526g have the smallest diameter relative to the other pins 516a-516f and 526a-526f. In this way, the thermal resistance in the center may be lower than using the same pin size everywhere. By grading the pin size in this manner, the maximum stress at the edge of the buffer cell may be decreased relative to a uniform pin size. More specifically, as stress tends to be larger in directions radially outwards of the stress buffer cell 572, use of graded pins decreases the maximum stress at the edges of the stress buffer cell 572 and the thermal resistance near a center of the stress buffer cell 572 is lower relative to a thermal resistance when using pins 516, 526 of a uniform size.

Referring now to FIGS. 6A-6B, a single sided stress buffer cell 672 is depicted. The single sided stress buffer cell 672 generally includes a DBC stack 600 coupled to a copper plate 610. The DBC stack 600 generally includes a ceramic layer 602 disposed between a first copper layer 604a and a second copper layer 604b (depicted in FIG. 6B). The ceramic layer 602 may be formed from Alumina ($Al_2O_3$), Aluminum nitride (AlN), Beryllium oxide (BeO), or the like.

In some embodiments, the ceramic layer 602 may generally have a larger footprint than the first copper layer 604a and the second copper layer 604b, as shown in FIGS. 6A and 6B. For example, one illustrative stress buffer cell may have a ceramic layer 602 that is about 17 mm long and 17 mm wide and both the first copper layer 604a and the second copper layer 604b are about 15 mm long and 15 mm wide such that the ceramic layer 602 extends a distance outwardly from the footprint of the first copper layer 604a and the second copper layer 604b when the ceramic layer 602, the first copper layer 604a, and the second copper layer 604b are arranged concentrically with one another. However, it should be appreciated that this is merely illustrative, and other dimensions (and relative sizes) are contemplated and included within the scope of the present disclosure.

The copper plate 610 includes a first major surface 612 and a second major surface 614 opposite the first major surface 612. The first major surface 612 of the copper plate 610 may be generally planar. The second major surface 614 of the copper plate 610 may generally include a plurality of pins 616 extending therefrom (e.g., a pinned surface). In some embodiments, the plurality of pins 616 extending from the second major surface 614 of the copper plate 610 may be integrated with the copper plate 610 such that formation of the copper plate 610 includes formation of the plurality of pins 616 extending from the second major surface 614 thereof. In other embodiments, the plurality of pins 616 may be separately formed and bonded to the second major surface 614 of the copper plate 610. Each one of the plurality of pins 616 includes a proximal end that is defined by an interface between the plurality of pins 616 and the second major surface 614 of the copper plate 610 and a distal end. The distal end of each one of the plurality of pins 616 is configured to be bonded to the first copper layer 604a of the DBC stack 600. For example, as particularly depicted in FIG. 6B, the plurality of pins 616 are bonded to the first copper layer 604a via a solder layer 630 disposed therebetween. However, it should be appreciated that other means of bonding the plurality of pins 616 to the first copper layer 604a are contemplated and included within the scope of the present disclosure, including those that utilize, for example, sintering, brazing, TLP, or similar binding processes. The shape and size of each one of the plurality of pins 616 is not limited by the present disclosure, and may be any shape and size. For example, in some embodiments, the plurality of pins 616 may be a plurality of nanowires similar to the nanowires described hereinbelow with respect to FIG. 7.

As depicted in FIG. 6A, the size of the copper plate 610 is generally such that a footprint thereof corresponds to a footprint of the first copper layer 604a of the DBC stack 600. That is, the length and the width of the copper plate 610 may generally correspond to a length and a width of the first copper layer 604a of the DBC stack 600. Such a corresponding size ensures that all of the pins 616 extending from the second major surface 614 of the copper plate 610 can be bonded to the first copper layer 604a of the DBC stack 600. However, it should be appreciated that such relative shapes and sizes are merely illustrative, and other relative shapes and/or sizes are contemplated and included within the scope of the present disclosure.

While FIGS. 6A-6B generally depicts the DBC stack 600 and the copper plate 610 as being generally concentric with one another, the present disclosure is not limited to such. That is, the DBC stack 600 and the copper plate 610 may be offset from one another. For example, the copper plate 610 may be offset by about a 0.005 mm displacement relative to the DBC stack 600 in some embodiments. Such a displacement may be considered acceptable because it results in a pin elongation of about 0.3% at a highest stress point. The pins 616 are provided on the copper plate 610 such that stress can be absorbed by the pins 616, thereby causing some deformation of the pins 616. This reduces the stress applied to the bonding interface due to the thermal expansion difference of the two different materials with different CTE on either side of the bonding interface.

While FIGS. 6A-6B depict the pins 616 as all generally having the same shape and size, the present disclosure is not limited to such. For example, as depicted in FIG. 6C, the various pins 616 may be differently sized in a functionally graded distribution to absorb stress in instances where the stress is larger in radially outward locations (e.g., near the outer edges of the stress buffer cell 672). More specifically, as shown in FIG. 6C, first pins 616a are centrally located and have a relatively larger diameter. As the stress buffer cell 672 is traversed from the central location to the outer edges thereof, the pins 616b-616g gradually shrink in diameter (e.g., when traversing outwards from pin 616a to pins 616g) such that the outermost pins 616g have the smallest diameter relative to the other pins 616a-616f. As previously discussed, the thermal resistance in the center may be lower than using the same pin size everywhere. By grading the pin size in this manner, the maximum stress at the edge of the buffer cell may be decreased relative to a uniform pin size.

Figure 7:
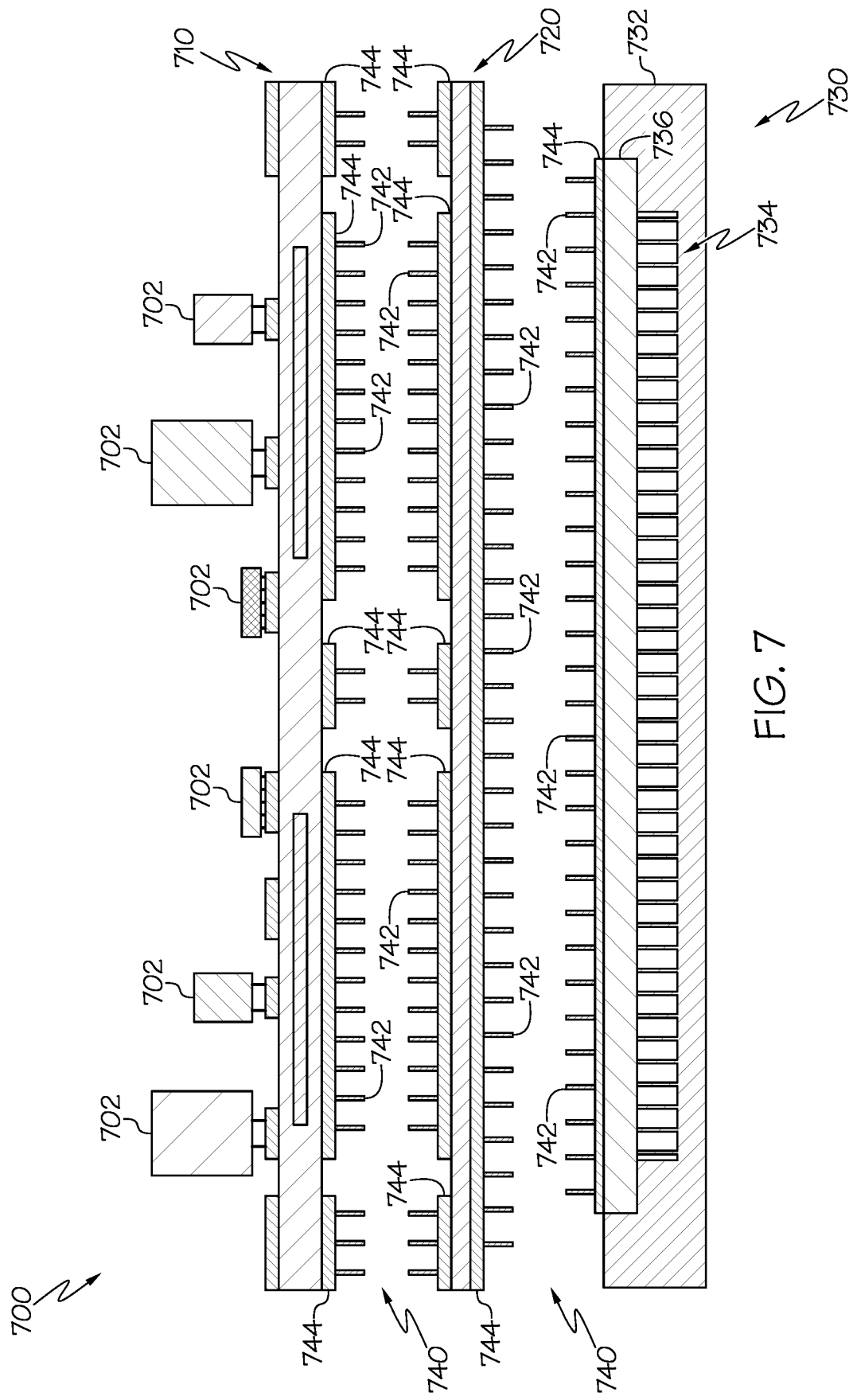
FIG. 7 schematically depicts an exploded side view of an illustrative stack including a multi-layer printed circuit board (PCB) stack with a plurality of embedded power devices, a direct bonded copper (DBC) layer, and a cold plate with nanowires therebetween for bonding according to one or more embodiments shown and described herein.

As noted hereinabove, the various components may be bonded together in a particular manner depending on the composition of the materials being bonded, such as, for example, sintering, soldering, brazing, TLP, or similar binding process. However, certain bonding processes may necessitate extreme conditions for bonding, such as reflow at high temperatures (e.g., soldering or silver sintering processed). Such extreme conditions may be detrimental for certain packages, and a bonding process that occurs at room temperature may be more desirable. As such, as depicted in FIG. 7, nanowire assemblies 740 may be disposed between components of a cooling system 700 for the purposes of effectuating nanowire bonding between components at or near room temperature (e.g., from about 20° C. to about 25° C.). That is, nanowire assemblies 740 may be disposed on a surface of a PCB stack 710 supporting electronic components 702 that is to be bonded, disposed on both major surfaces of an insulation substrate 720 (e.g., a DBC stack as discussed herein), and/or on a portion of a cooling assembly 730 (e.g., on a cold plate 736 having fins 734 and embedded within a cooling manifold 732 as discussed herein).

The nanowire assemblies are generally a metallic lawn that is grown on the surfaces for which a bond is needed through an active galvanic process. Each one of the nanowire assemblies 740 generally include a metal bump 744 having one or more nanowires 742 disposed or formed thereon. The metal bump 744 is generally any metal that can be joined to a surface of the cooling assembly 730, the insulation substrate 720, and/or the PCB stack 710. Illustrative metals that are used for both the bump 744 and the nanowires 742 include, but are not limited to, copper, silver, gold, nickel, zinc, platinum, combinations thereof, compositions including the same, and/or the like. The process of providing the bumps 744 with the nanowires 742 extending therefrom generally involves a process whereby a mask is placed on a surface for which the nanowire assemblies 740 are desired (e.g., the various surfaces described herein), applying a galvanic process that includes use of a sponge having a porosity layer that is filled with metal, and performing a stripping process that results in the nanowires 742 extending from the bumps 744 which are bonded to the surfaces. In some embodiments, the resulting nanowires 742 each have a diameter from about 30 nm to about 4 μm and a length from about 1 μm to about 50 μm. Once formed, a process may be used to join the various nanowires 742 together to form the bond, such as various processes employed by NanoWired GmbH (Gernsheim, Germany), including, but not limited to, the KlettWelding technique and/or the NanoWiring technique. Put another way, one side of the insulation substrate 720 is patterned to separate the copper layer thereof (when the insulation substrate 720 is a DBC substrate) into different areas. A surface of the cooling assembly 730 (e.g., an aluminum surface of the cold plate 736) is plated with a thin copper layer (but may not be necessary if cold plate is made of Al—Cu composite). Nanowires are grown on the bonding surfaces and are then bonded together using one of the aforementioned nanowiring techniques at room temperature or elevated temperature depending on the bonding force requirement.

Use of the nanowire assemblies 740 (e.g., the low temperature nanowire bonding technique) results in a structure that has a different bonding force for different nano wire bonding variants. In general, nanowire bonds have a bonding force that is relatively lower than typical high temperature bonding solutions. Therefore, the nanowire bonding techniques described herein may be combined with various stress mitigation solutions, such as those described herein with respect to the stress buffer cells. If the material on both sides of the nanowire bonding interface is copper, the stress applied to the bonding interface is small. As such, the PCB stack 710, the insulation substrate 720 (particularly a DBC substrate) and the cooling assembly 730 (particularly a Cu—Al composite cold plate) may be a preferable combination for nanowire bonding.

One benefit of the nanowire bonding techniques described herein includes an ability to join at room temperature, as the process not only removes the reflow process and protects the semiconductor components, but is also applicable to polymer films. Another benefit is improved long-term stability because the use of just one type of metal to make the interconnections instead of using alloys or metallic compounds prevents embrittlement of the interconnection as a result of temperature cycling. Another benefit is high electrical and thermal conductivity because the purely metallic interconnection of metals (e.g. copper, gold, or nickel) has significantly higher electrical and thermal conductivities than any soldered, bonded, glued, screwed, or welded joint. Another benefit is high temperature resistance because, after bonding, the connections are resistant to high temperatures greater than about 600° C. and thus, a direct thermal connection, needing no additives, is possible. Another benefit is no heavy metals because replacing gold with copper eliminates the polluting gold recycling processes. In addition, no heavy or rare-earth metals are used in the interconnections.

Figure 8:
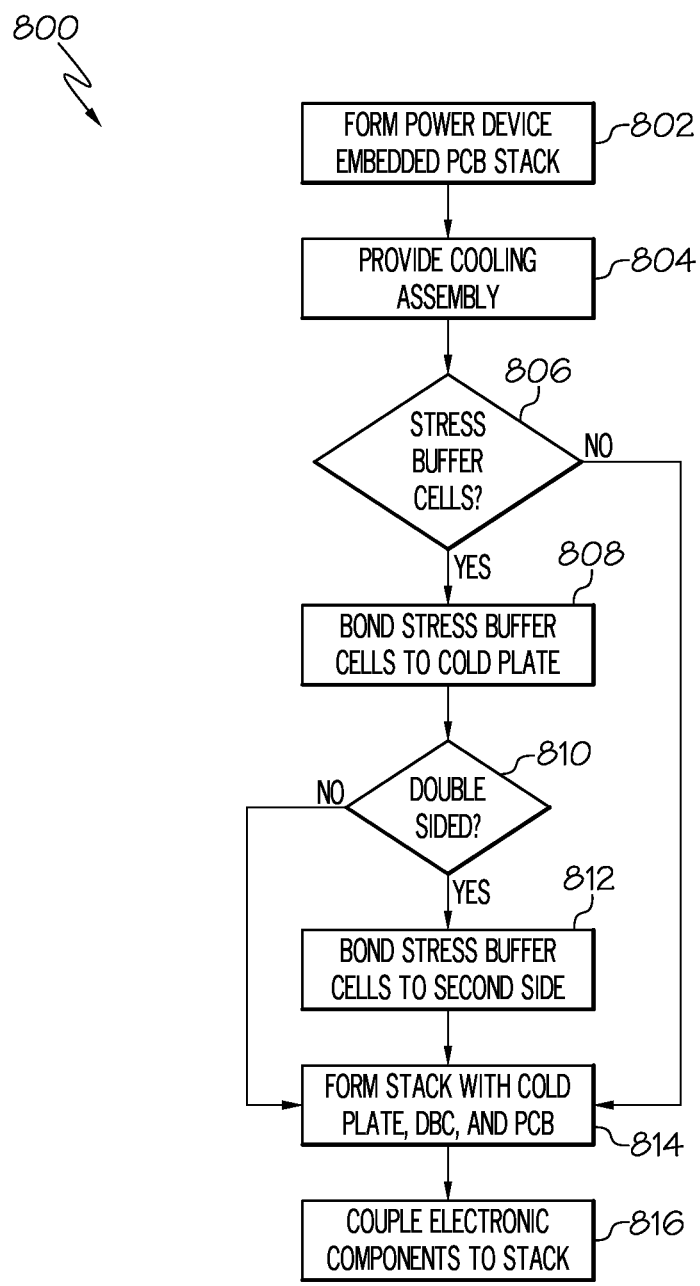
FIG. 8 depicts a flow diagram of an illustrative method of forming a cooling system according to one or more embodiments shown and described herein.

Turning to FIG. 8, a method 800 of forming a cooling system having an embedded power device PCB stack and a cooling device including a cold plate as described hereinabove will now be described. It should be understood that the order of the process described herein with respect to FIG. 8 is merely illustrative, and that the present disclosure is not limited to the order described herein. An illustrative example of a particular ordering of steps will be described herein, but the present disclosure is not limited to such an example.

Referring to FIG. 8, the method 800 includes, at block 802, a power device embedded PCB stack is formed. The power device embedded PCB stack may be formed by laminating a first major substrate, a second major substrate and a pre-preg layer disposed between the first major substrate and the second major substrate together. The power device embedded PCB stack may be processed using an etching process applied to the first major substrate to etch out a predetermined pattern corresponding to the size and shape of one or more power device stacks. The pre-preg layer is machined to remove pre-preg material such that the one or more power device stacks may be received within the power embedded PCB substrate. Block 802 further includes forming one or more power device stacks by coupling a substrate to a power device. In some embodiments, the first substrate 135 (e.g., a first copper substrate) is formed with a cavity therein, the cavity being shaped and sized to receive one or more power devices therein, as described herein. In some embodiments, the first substrate may be formed by providing a substrate and machining the cavity by removing material therefrom (e.g., machining the cavity). In other embodiments, the first substrate may be formed such that a cavity is present within the substrate (e.g., forming via an additive manufacturing process or the like). In some embodiments, the cavity may not be formed (e.g., embodiments where the power device is placed directly on a surface of the substrate not including a cavity therein). The power device stacks are arranged and fastened within the recesses formed within the power device embedded PCB stack. Fastening techniques such as bonding or adhering with resin may be used. One or more additional layers of conductive and/or pre-preg material layers may be laminated to the top and/or bottom of the power device embedded PCB stack. These layers may be further processed with etching, drilling, machining, and other processes to form interconnected layers for electrical power transfer as well as thermal conductance. Conducive vias may be formed within the layers of the PCB stack. For example, a via-hole may be drilled with a mechanical drilling process, a laser drilling process, or the like. Once the via-hole is formed, a conductive material may be flowed into the via-hole to form an electrical or thermal pathway through a pre-preg layer. Electrical components are mounted to the PCB stack.

At block 804, the cooling assembly is provided. That is, the manifold may be formed with the at least one inlet and the at least one outlet, the cold plate may be formed with or without the recesses for the stress buffer cells, and/or the fin structure of the heat sink may be formed on the cold plate. The cold plate, with or without the heat sink, may be placed within a recess of the manifold, resulting in the cooling assembly described herein.

As noted above, the cold plate may or may not include recesses therein for receiving stress buffer cells. As such, a determination may be made at block 806 as to whether stress buffer cells are being included. If yes, the process proceeds to block 808. If not, the process proceeds to block 814.

At block 808, the stress buffer cells are bonded to the cold plate. That is, each one of the stress buffer cells is bonded within the recesses in the cold plate using any suitable bonding technique. Illustrative bonding techniques include, but are not limited to, sintering, soldering, brazing, TLP, or similar process. In some embodiments, nanowire bonding may be employed to bond the stress buffer cells to the cold plate. Either the double sided stress buffer cells of FIGS. 5A-5C or the single sided stress buffer cells of FIGS. 6A-6C may be bonded to the cold plate within the recesses thereof.

Still referring to FIG. 8, the cooling assembly may be double sided in some embodiments. That is, a second cold plate may form at least a portion of the second major surface of the cooling assembly. In such embodiments, if the second cold plate also includes recesses for stress buffer cells, the stress buffer cells may be bonded to the second cold plate as well. Accordingly a determination is made at block 810 as to whether the cooling assembly is double sided and including a second cold plate with recesses therein for stress buffer cells. If the cooling assembly is double sided, the process proceeds to block 812. If not, the process proceeds to block 814.

At block 812, additional stress buffer cells are bonded to the second cold plate. That is, each one of the stress buffer cells is bonded within the recesses in the second cold plate using any suitable bonding technique. Illustrative bonding techniques include, but are not limited to, sintering, soldering, brazing, TLP, or similar process. In some embodiments, nanowire bonding may be employed to bond the stress buffer cells to the second cold plate. Either the double sided stress buffer cells of FIGS. 5A-5C or the single sided stress buffer cells of FIGS. 6A-6C may be bonded to the second cold plate within the recesses thereof.

Still referring to FIG. 8, a stack is formed at block 814. That is, the cooling assembly, particularly the cold plate with or without the buffer cells thereon, is bonded to the PCB stack via the insulation substrate (e.g., DBC substrate) as described herein. As previously discussed, the components may be coupled together via any bonding technique including, but not limited to, sintering, soldering, brazing, TLP, or similar processes. In particular embodiments, the cooling assembly, particularly the cold plate with or without the buffer cells thereon, is bonded to the PCB stack via the insulation substrate (e.g., DBC substrate) using the nanowire bonding processes described herein.

At block 816, electrical components may be coupled to the formed stack. For example, electrical components be mounted through a pick-and-place operation, soldering, or other mechanical and electrical fastening means. In addition, external cooling assemblies and/or other electrical systems such as a capacitor pack or the like may be coupled to the PCB. It is understood that the process depicted in FIG. 8 and described herein is one embodiment. Some steps may be omitted and/or performed in a different order while achieving the same result.

It should now be understood that the cooling systems described herein include power devices (e.g., embedded power semiconductor devices) embedded within substrates, such as gate driver printed circuit boards (PCBs), that are bonded to cooling devices, such as a cold plate, having recesses therein that hold stress buffer cells therein, which absorb some of the stress applied by the joining of the PCB and cold plate due to the pins of the stress buffer cells (which can bend/deform). In some embodiments, the various components of the cooling systems described herein may be bonded together using nanowire bonds, which can be achieved at or near room temperature, thereby avoiding application of excessive heat and reflow that is necessary for traditional bonding processes. As a result, the cooling systems described herein effectively spread heat so that the thermal resistance is reduced and the need for a grease layer is eliminated. In addition, use of DBC as the electrical insulation and the use of a cold plate made from a copper-aluminum composite reduces the CTE mismatch between the bonded parts. Further, the copper-aluminum composite and/or some other composite (e.g., Cu/Mo, Cu/W) heat sink also reduces the embedded power device temperature due to effective heat spreading by the copper layer.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system, comprising:
    a power device embedded PCB stack;
    a cooling assembly comprising a cold plate having one or more recesses therein; and
    a buffer cell disposed within each of the one or more recesses, the buffer cell comprising at least one copper plate having a pinned surface;
    wherein the cooling assembly is bonded to the PCB stack with a insulation substrate disposed therebetween, the cooling assembly arranged such that the buffer cell faces the PCB stack and absorbs stress generated at an interface of the PCB stack and the cooling assembly.

2. The system of claim 1, wherein the power device PCB stack comprises one or more cavities defined by a substrate that are configured to receive a power device therein.

3. The system of claim 1, wherein the cooling assembly further comprises:
    a cooling manifold;

at least one fluid inlet fluidly coupled to the cooling manifold; and at least one fluid outlet fluidly coupled to the cooling manifold, wherein cooling fluid is introduced to the cooling manifold via the at least one fluid inlet and carried out of the cooling manifold via the at least one fluid outlet.

4. The system of claim 3, wherein the cooling manifold is shaped to surround at least a portion of the cold plate.

5. The system of claim 3, wherein the at least one fluid inlet and the at least one fluid outlet extend from a same surface of the cooling manifold.

6. The system of claim 3, wherein the at least one fluid inlet extends from a first surface of the cooling manifold and the at least one fluid outlet extend from a second surface of the cooling manifold.

7. The system of claim 1, wherein the cold plate comprises a first major surface opposite a second major surface, the one or more recesses defined by the first major surface.

8. The system of claim 7, wherein the cooling assembly further comprises a heat sink coupled to or integrated with the second major surface of the cold plate.

9. The system of claim 1, wherein the buffer cell is aligned with the power device disposed within the PCB stack when the cooling assembly is bonded to the PCB stack.

10. The system of claim 1, wherein the buffer cell is a double sided stress buffer cell, the at least one copper plate comprising:
a first copper plate having a first pinned surface; and
a second copper plate having a second pinned surface;
wherein the buffer cell further comprises a DBC stack positioned between the first copper plate and the second copper plate such that the first pinned surface and the second pinned surface are facing the DBC stack and are coupled to the DBC stack via a solder layer.

11. The system of claim 1, wherein:
the buffer cell is a single sided stress buffer cell comprising a DBC stack; and
the at least one copper plate having the pinned surface is coupled to the DBC stack via a solder layer.

12. The system of claim 1, wherein the pinned surface of the at least one copper plate comprises a plurality of functionally graded pins disposed between the at least one copper plate and a DBC stack.

13. The system of claim 1, wherein the insulation substrate is a DBC substrate comprising a ceramic layer disposed between copper layers.

14. The system of claim 1, wherein a power module comprising the PCB stack and the power device has a power rating greater than or equal to 40 kilowatts (kW).

15. A system, comprising:
a power device embedded PCB stack;
a cooling assembly comprising a cold plate having one or more recesses therein; and
a buffer cell disposed within each of the one or more recesses, the buffer cell comprising at least one copper plate having a pinned surface,
wherein the cooling assembly is bonded by nanowire bonds to the PCB stack such that an insulation substrate is disposed between the cooling assembly and the PCB stack.

16. The system of claim 15, wherein the nanowire bonds are formed from metal bumps comprising nanowires disposed on a surface of the PCB stack and on a surface of the cooling assembly.

17. The system of claim 15, wherein the at least one copper plate having the pinned surface comprises:
a first copper plate having a first pinned surface; and
a second copper plate having a second pinned surface; and
wherein the buffer cell further comprises:
a DBC stack positioned between the first copper plate and the second copper plate such that the first pinned surface and the second pinned surface are facing the DBC stack and are coupled to the DBC stack via a solder layer.

18. The system of claim 15, wherein:
the buffer cell further comprises a DBC stack; and
the at least one copper plate having the pinned surface is coupled to the DBC stack via a solder layer.

19. A method of forming a cooling system, comprising:
bonding a stress buffer cell to a cold plate within a recess of the cold plate, the stress buffer cell comprising at least one copper plate having a pinned surface; and
joining a power device embedded PCB stack to the cold plate using an insulation substrate disposed between the PCB stack and the cold plate, wherein the copper plate of the stress buffer cell faces the power device PCB stack to absorb stress generated at an interface of the PCB stack and the cold plate.

20. The method of claim 19, wherein joining the PCB stack to the cold plate comprises depositing nanowire assemblies on the PCB stack and the cold plate and joining nanowires from the nanowire assemblies together to form a bond.

* * * * *